(12) United States Patent
Zhang et al.

(10) Patent No.: US 11,418,171 B2
(45) Date of Patent: Aug. 16, 2022

(54) LOW POWER CONSUMPTION SWITCHING CIRCUIT WITH VOLTAGE ISOLATION FUNCTION FOR PMOS TRANSISTOR BULK, AND INTEGRATED CHIP

(71) Applicant: GREE ELECTRIC APPLIANCES, INC. OF ZHUHAI, Guangdong (CN)

(72) Inventors: Liang Zhang, Zhuhai (CN); Dongbai Yi, Zhuhai (CN); Jing Wang, Zhuhai (CN); Yongguang Zhang, Zhuhai (CN); Cong Wang, Zhuhai (CN)

(73) Assignee: GREE ELECTRIC APPLIANCES, INC. OF ZHUHAI, Guangdong (CN)

( * ) Notice: Subject to any disclaimer, the term of this patent is extended or adjusted under 35 U.S.C. 154(b) by 0 days.

(21) Appl. No.: 17/206,034

(22) Filed: Mar. 18, 2021

(65) Prior Publication Data

US 2021/0320648 A1     Oct. 14, 2021

Related U.S. Application Data

(63) Continuation of application No. PCT/CN2019/108997, filed on Sep. 29, 2019.

(30) Foreign Application Priority Data

Nov. 14, 2018   (CN) .......................... 201811354080.5

(51) Int. Cl.
   *H03K 3/012*     (2006.01)
   *H03K 17/687*    (2006.01)

(52) U.S. Cl.
   CPC ......... *H03K 3/012* (2013.01); *H03K 17/6872* (2013.01)

(58) Field of Classification Search
   CPC .......................... H03K 3/012; H03K 17/6872
   See application file for complete search history.

(56) References Cited

U.S. PATENT DOCUMENTS

| | | | |
|---|---|---|---|
| 2004/0239403 A1* | 12/2004 | Farley ................ | H03K 17/0822 327/437 |
| 2009/0167410 A1 | 7/2009 | Yoshikawa et al. | |
| 2018/0076716 A1* | 3/2018 | Kawashima ............ | H02M 1/08 |

FOREIGN PATENT DOCUMENTS

| | | |
|---|---|---|
| CN | 103178830 A | 6/2013 |
| CN | 104270143 A | 1/2015 |

(Continued)

*Primary Examiner* — Sibin Chen
(74) *Attorney, Agent, or Firm* — Brandon V. Zuniga; James R. Gourley; Carstens & Cahoon, LLP

(57) ABSTRACT

Disclosed is a low power consumption switching circuit with voltage isolation function for a PMOS transistor bulk, including a bulk voltage switching control unit, a bulk voltage switching unit, a first voltage input terminal, a second voltage input terminal, and a bulk voltage output terminal. The bulk voltage switching control unit includes a plurality of PMOS transistors and weak pull-down devices, and is configured to generate a control signal to control the bulk voltage switching unit to make the bulk voltage output terminal to be connected to a higher potential between the first voltage input terminal and the second voltage input terminal. The bulk voltage switching unit includes a plurality of PMOS transistors, and is configured to connect bulks of the PMOS transistors to the higher potential between the first voltage input terminal and the second voltage input terminal. Each of the PMOS transistors is a low-withstand-voltage device.

8 Claims, 5 Drawing Sheets

(56) References Cited

FOREIGN PATENT DOCUMENTS

| | | | |
|---|---|---|---|
| CN | 104993574 | A | 10/2015 |
| CN | 105049029 | A | 11/2015 |
| CN | 106656164 | A | 5/2017 |

* cited by examiner

LOW POWER CONSUMPTION SWITCHING CIRCUIT WITH VOLTAGE ISOLATION FUNCTION FOR PMOS TRANSISTOR BULK, AND INTEGRATED CHIP

CROSS REFERENCE TO RELATED APPLICATIONS

The present application is a continuation application of the PCT application No. PCT/CN2019/108997, filed on Sep. 29, 2019 and published as WO 2020/098404 A1 on May 22, 2020, and titled "Low Power Consumption Switching Circuit with Voltage Isolation Function for PMOS Transistor Bulk, and Integrated Chip", which claims the benefit of the priority of Chinese Patent Application No. 201811354080.5, filed on Nov. 14, 2018, entitled "Low Power Consumption Switching Circuit with Voltage Isolation Function for PMOS Transistor Bulk", and the entire contents of which are incorporated herein by reference. Every application and publication listed in this paragraph is hereby incorporated by reference in its entirety.

TECHNICAL FIELD

This disclosure relates to the field of integrated circuit design, and in particular, to a low power consumption switching circuit with voltage isolation function for a PMOS transistor bulk, and an integrated chip.

BACKGROUND

For the design of an integrated circuit chip, the PMOS transistor bulk is generally connected to a highest potential, and the NMOS transistor bulk is connected to a lowest potential, so as to ensure that a parasitic PN junction between the source the drain and the bulk is in a reverse bias, and prevent a current leakage or a latch-up effect. For a multi-power-supply system, a common practice is to design a special switching circuit for the bulk, so as to select the highest potential in the multi-power-supply system to ensure a normal power supply for the circuit module.

As shown in FIG. 1, a related switching circuit for the bulk known to the inventors comprises two diodes. Two input terminals ($V_{CC}$, $V_{SPAD}$) are connected to positive terminals of two diodes, respectively, and negative terminals of the two diodes are connected together to form an output terminal $V_{MAX}$. This circuit is very simple, but the defects are also obvious. When two voltages are relatively approximate, that is, when the voltage difference is lower than a voltage threshold $V_{TH}$ of the PN junction, the switching circuit for the output terminal $V_{MAX}$ cannot complete the function of switching voltage, and may even cause the latch-up effect.

In a switching circuit for the PMOS transistor bulk known to the inventors, the switching circuit for the PMOS transistor bulk at least includes: a first PMOS transistor, a second PMOS transistor, a third PMOS transistor, a weak pull-down device, a first voltage input terminal, a second voltage input terminal, and a voltage output terminal of the bulk. A drain of the first PMOS transistor and a drain of the second PMOS transistor are connected to the voltage output terminal of the bulk. A gate of the first PMOS transistor is connected to a drain of the third PMOS transistor and connected to the ground by means of the weak pull-down device. A source of the first PMOS transistor, a gate of the second PMOS transistor, and a gate of the third PMOS transistor are all connected to the first voltage input terminal. The source of the second PMOS transistor and the source of the third PMOS transistor are both connected to the second voltage input terminal. This switching circuit solves the problem of a low resolution of voltage difference, and realizes an automatic switching according to the amount of input voltages of multiple power supplies. Moreover, the circuit is simple and practical, and a silicon area is small. However, when the power supply voltage exceeds a normal withstand voltage range of the device, the circuit has the risk of withstand voltage breakdown, and the switching functions for the bulk all fail.

Nowadays, the mainstream 32-bit general-purpose MCU control chips in the market all support 5V-Tolerance IO function (namely, devices with a normal working voltage of 3.3V can withstand a voltage of up to 5V but are not damaged). Therefore, it has become an urgent problem to provide an automatic switching circuit to achieve a high withstand voltage by means of a device with a low withstand voltage.

SUMMARY

In order to overcome the technical problem in the prior art that, when a power supply voltage exceeds a normal range for a withstand voltage of the device, the device is prone to be broken down due to the withstand voltage, which causes a failure of the switching function for a bulk. In view of this, a low power consumption switching circuit with voltage isolation function for a PMOS transistor bulk is provided.

A low power consumption switching circuit with voltage isolation function for a PMOS transistor bulk includes a bulk voltage switching control unit, a bulk voltage switching unit, a first voltage input terminal, a second voltage input terminal, and a voltage output terminal of the bulk. The bulk voltage switching control unit includes a plurality of PMOS transistors and a plurality of weak pull-down devices, and is configured to generate a control signal to control the bulk voltage switching unit to make the bulk voltage output terminal to be connected to a higher potential between the first voltage input terminal and the second voltage input terminal at all time. The bulk voltage switching unit comprises a plurality of PMOS transistors, and is configured to connect bulks of the PMOS transistors to the higher potential between the first voltage input terminal and the second voltage input terminal at all time. Each of the PMOS transistors is a low-withstand-voltage device.

In one of the embodiments, the bulk switching control unit includes a first PMOS transistor, a second PMOS transistor, a third PMOS transistor, a fourth PMOS transistor, and weak pull-down devices. The source of the first PMOS transistor is connected to the second voltage input terminal by means of a first weak pull-down device. A drain of the first PMOS transistor is connected to a ground by means of a second weak pull-down device. A gate of the first PMOS transistor is connected to the first voltage input terminal. The source of the second PMOS transistor is connected to a drain of the fourth PMOS transistor. The drain of the second PMOS transistor is connected to the ground $V_{GND}$ by means of a third weak pull-down device. The a gate of the second PMOS transistor is connected to the ground by means of a fourth weak pull-down device. The gate of the second PMOS transistor is also connected to a gate of the third PMOS transistor. The source of the third PMOS transistor is connected to the bulk voltage output terminal by means of a fifth weak pull-down device. The source of the third PMOS transistor is also connected to a gate of the fourth PMOS transistor. A drain of the third PMOS transistor is connected to the ground by means of a sixth weak pull-down device. The gate of the third PMOS transistor is connected to the drain of the first PMOS transistor and the gate of the second PMOS transistor. The gate of the third PMOS transistor is also connected to the ground by mean of a seventh weak pull-down device. A source of the four PMOS transistor is connected to the bulk voltage output terminal by means of an eighth weak pull-down device. The drain of the fourth PMOS transistor is connected to the source of the second PMOS transistor. The gate of the fourth PMOS transistor is connected to the bulk voltage output terminal. The gate of the fourth PMOS transistor is also connected to the source of the third PMOS transistor.

In one of the embodiments, each of the weak pull-down devices is a current source device, a resistor, or a combination of the current source device and the resistor.

In one of the embodiments, the weak pull-down devices include a first resistor, a second resistor, a third resistor, a fourth resistor, a fifth resistor, and current source devices. The current source devices include a first NMOS transistor, a second NMOS transistor, and a third NMOS transistor. One end of the first resistor is connected to the source of the first PMOS transistor, and another end of the first resistor is connected to the second voltage input terminal. One end of the second resistor is connected to the drain of the first PMOS transistor and a gate of the first NMOS transistor, respectively; another end of the second resistor is connected to the ground. One end of the third resistor is connected to a drain of the first NMOS transistor and a gate of the second NMOS transistor respectively, and another end of the third resistor is connected to the first voltage input terminal. A source of the first NMOS transistor is connected to the ground. One end of the fourth resistor is connected to the source of the fourth PMOS transistor, and another end of the fourth resistor is connected to the bulk voltage output terminal. One end of the fifth resistor is connected to the source of the third PMOS transistor and the gate of the fourth PMOS transistor respectively, and another end of the fifth resistor is connected to the bulk voltage output terminal. The drain of the first NMOS transistor is connected to the first voltage input terminal by means of the third resistor, the drain of the first NMOS transistor is also connected to the gate of the second NMOS transistor, and the gate of the first NMOS transistor is connected to the drain of the first PMOS transistor. A source of the second NMOS transistor is connected to the ground, a drain of the second NMOS transistor is connected to the drain of the second PMOS transistor, and the gate of the second NMOS transistor is connected to the drain of the first NMOS transistor. A source of the third NMOS transistor is connected to the ground, a drain of the third NMOS transistor is connected to the drain of the third PMOS transistor, and a gate of the third NMOS transistor is connected to the gate of the third PMOS transistor and the gate of the second PMOS transistor, respectively.

In one of the embodiments, the bulk switching unit further includes a fifth PMOS transistor and a sixth PMOS transistor. A source of the fifth PMOS transistor is connected to the bulk voltage output terminal, a drain of the fifth PMOS transistor is connected to the first voltage input terminal, and a gate of the fifth PMOS transistor is connected to the source of the second PMOS transistor and the drain of the fourth PMOS transistor respectively. A source of the sixth PMOS transistor is connected to the bulk voltage output terminal, a drain of the sixth PMOS transistor is connected to the second voltage input terminal, and a gate of the sixth PMOS transistor is connected to the source of the third PMOS transistor and the gate of the fourth PMOS transistor, respectively.

In one of the embodiments, a bulk of the first PMOS transistor, a bulk of the first second PMOS transistor, a bulk of the third PMOS transistor, a bulk of the fourth PMOS transistor, a bulk of the fifth PMOS transistor, and a bulk of the sixth PMOS transistor are connected together.

In one of the embodiments, threshold voltages of the first PMOS transistor, the second PMOS transistor, the third PMOS transistor, the fourth PMOS transistor, the fifth PMOS transistor, and the sixth PMOS transistor each are $V_{TH}$. The first voltage input terminal is $V_{CC}$, the second voltage input terminal is $V_{SPAD}$, and the voltage output terminal of the bulk is $V_{MAX}$. When $V_{SPAD} \leq V_{CC}$, $V_{MAX}$ is switched to $V_{CC}$. When $V_{SPAD} \geq V_{CC} + V_{TH}$, $V_{MAX}$ is switched to $V_{SPAD}$.

An integrated chip includes the above-mentioned low power consumption switching circuit with voltage isolation function for the PMOS transistor bulk.

From the above description of the present disclosure, it can be seen that, compared with the prior art, the low power consumption switching circuit with voltage isolation function for the PMOS transistor bulk provided by the present disclosure adopts an isolation method for device withstand voltage, thereby making the withstand voltage of the device to be controlled within the safe working range, enabling the device with a low withstand voltage to realize a high withstand voltage by means of the automatic switching circuit for the bulk, increasing the resolution of the difference between the power supply voltages, lowering the power consumption. The present disclosure not only reduces the production cost of the chip, but also improves the compatibility of the withstand voltage of the chip, thereby broadening the disclosure scope of the chip.

DETAILED DESCRIPTION OF DISCLOSED EMBODIMENTS

In order to make the objectives, technical solutions and advantages of the present disclosure clearer and better understood, a low power consumption switching circuit with voltage isolation function for a PMOS transistor bulk of the present disclosure will be further described in detail below through embodiments with reference to accompanying drawings. It should be understood that the specific embodiments described herein are merely illustration of the present disclosure, but not intended to limit the present disclosure.

Figure 1:
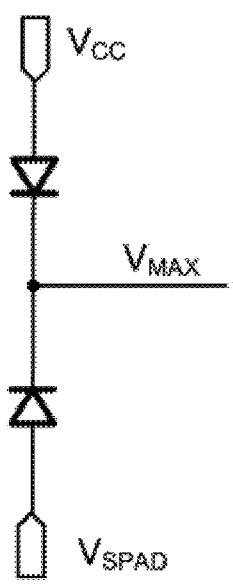
FIG. 1 is a related switching circuit for a bulk in the prior art.
Figure 2:
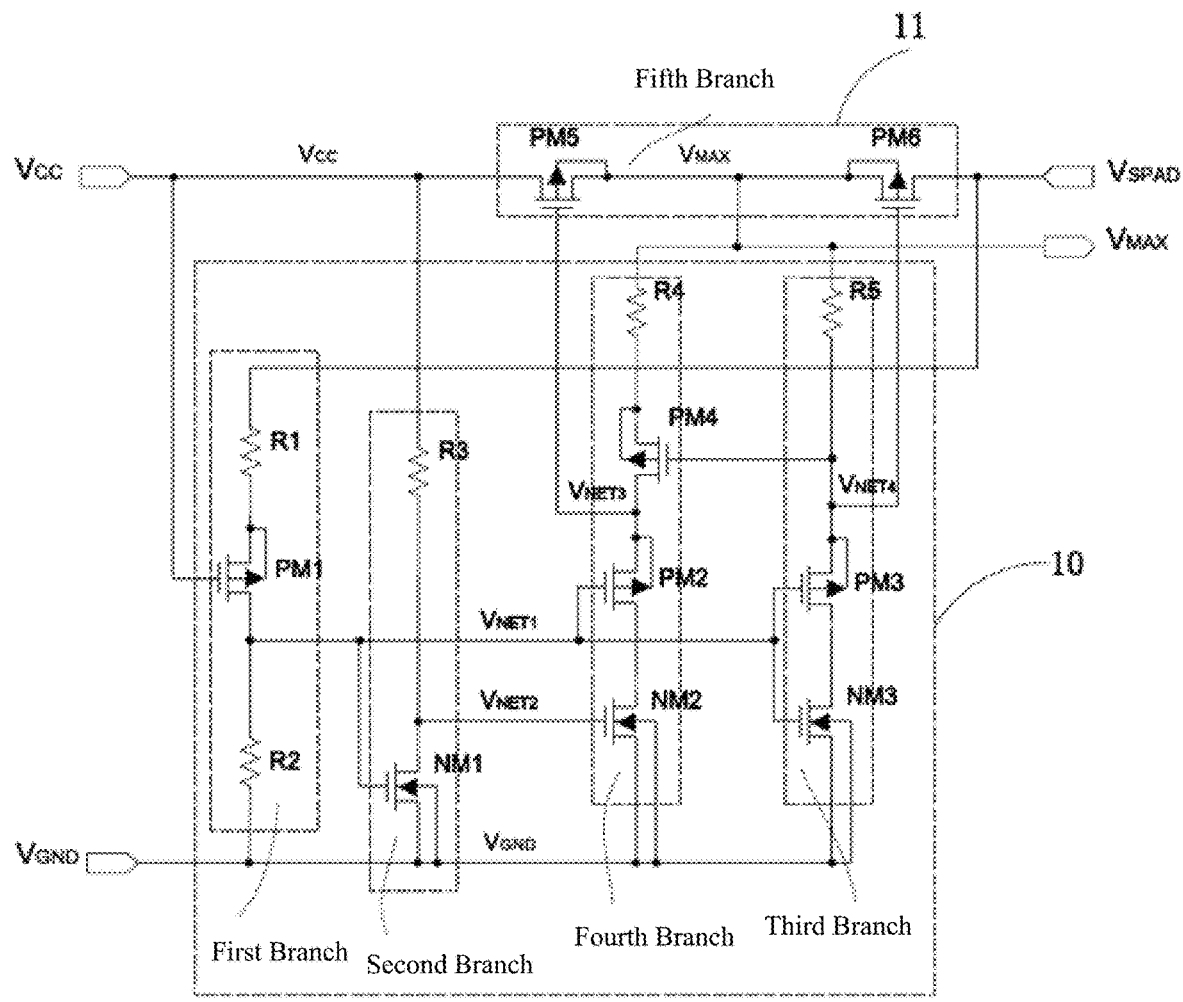
FIG. 2 is a view of a low power consumption switching circuit with voltage isolation function for a PMOS transistor bulk of the present disclosure.

As shown in FIG. 2, a low power consumption switching circuit with voltage isolation function for a PMOS transistor bulk includes a bulk voltage switching control unit 10, a bulk voltage switching unit 11, a first voltage input terminal $V_{CC}$, a second voltage input terminal $V_{SPAD}$, and a bulk voltage output terminal $V_{MAX}$. The bulk voltage switching control unit 10 includes a plurality of PMOS transistors and a plurality of weak pull-down devices, and generates a voltage control signal. Specifically, the bulk voltage switching control unit 10 generates a reasonable judgment logic level, and controls the bulk voltage switching unit 11 to make the bulk voltage output terminal $V_{MAX}$ to be connected to the highest potential between the first voltage input terminal $V_{CC}$ and the second voltage input terminal $V_{SPAD}$ at all times. The bulk voltage switching unit 11 includes a plurality of PMOS transistors, and is configured to connect the bulks of the PMOS transistors to a higher potential between the first voltage input terminal $V_{CC}$ and the second voltage input terminal $V_{SPAD}$ at all time. Each of the PMOS transistors is a low-withstand-voltage device.

According to electrical parameters information of the device provided by a specification document of the process control monitoring (PCM) of the process plant, the available MOS devices and withstand voltage characteristics are as follows:

| Spice Name | Transistor type | Temperature | Vd(V) | Vg(V) | Vb(V) |
|---|---|---|---|---|---|
| n11ll_ckt | 1.1 V NMOS | −40° C. to 125° C. | 0 to 1.2 | 0 to 1.2 | −1.2 to 0 |
| p11ll_ckt | 1.1 V PMOS | | −1.2 to 0 | −1.2 to 0 | 0 to 1.2 |
| nlvt11ll_ckt | 1.1 V LVT NMOS | | 0 to 1.2 | 0 to 1.2 | −1.2 to 0 |
| plvtll_ckt | 1.1 V LVT PMOS | | −1.2 to 0 | −1.2 to 0 | 0 to 1.2 |
| nhvt11ll_ckt | 1.1 V HVT NMOS | | 0 to 1.2 | 0 to 1.2 | 0 to 1.2 |
| phvt11ll_ckt | 1.1 V HVT PMOS | | −1.2 to 0 | −1.2 to 0 | 0 to 1.2 |
| n25ll_ckt | 2.5 V NMOS | | 0 to 2.5 | 0 to 2.5 | −2.5 to 0 |
| p25ll_ckt | 2.5 V PMOS | | −2.5 to 0 | −2.5 to 0 | 0 to 2.5 |
| nud18ll_ckt | 2.5 V UD 1.8 V NMOS | | 0 to 1.2 | 0 to 1.2 | 0 |
| pud18ll_ckt | 2.5 V UD 1.8 V PMOS | | −1.8 to 0 | −1.8 to 0 | 0 |
| nod33ll_ckt | 2.5 V OD 3.3 V NMOS | | 0 to 3.3 | 0 to 3.3 | 0 |
| pod33ll_ckt | 2.5 V OD 3.3 V PMOS | | −3.3 to 0 | −3.3 to 0 | 0 |
| nld33ll_ckt | 2.5 V LDNMOS | | 0 to 5 | 0 to 2.5 | 0 |
| pld33ll_ckt | 2.5 V LDPMOS | | −5 to 0 | −2.5 to 0 | 0 |
| nld50ll_ckt | 2.5 V OD 3.3 V LDNMOS | | 0 to 5 | 0 to 3.3 | 0 |
| pld50ll_ckt | 2.5 V OD 3.3 V LDPMOS | | −5 to 0 | −3.3 to 0 | 0 |

For application scenarios of input power of 3.3V which support 5V-tolerance, as shown in the above table, the available device types are: nod33ll_ckt, pod33ll_ckt, nld50ll_ckt, and pld50ll_ckt. A device of a type nod33ll_ckt or pod33ll_ckt is an ordinary device with a withstand voltage of 3.3V, and a safe working voltage range of each port is 0 to 3.3V. A device of a type nod50ll_ckt or pod50ll_ckt is a device with a withstand voltage of 5.0V, and a safe working voltage range of the gate thereof is 0 to 3.3V, a safe working voltage range of the drain and the source thereof is 0-5.0V. Since the gate cannot withstand a voltage of 5.V, the device is not a complete high-withstand-voltage functional device. Therefore, when the power supply of 5.0.V is input, it is necessary to design a reasonable isolation circuit to ensure that the voltage of each port of the device is within the safe voltage range. The PMOS transistors PM1 to PM6 are devices of type PLD50LL_CKT. The NMOS transistors NM1 to NM3 are devices of type NLD33LL_CKT. The resistors R1-R5 are general-purpose Poly resistors.

As shown in FIG. 2, the bulk switching control unit 10 includes a first PMOS transistor PM1, a second PMOS transistor PM2, a third PMOS transistor PM3, a fourth PMOS transistor PM4, and weak pull-down devices. A source of the first PMOS transistor PM1 is connected to the second voltage input terminal $V_{SPAD}$ by means of a first weak pull-down device, a drain of the first PMOS transistor PM1 is connected to a ground $V_{GND}$ by means of a second weak pull-down device, and a gate of the first PMOS transistor PM1 is connected to the first voltage input terminal $V_{CC}$. A source of the second PMOS transistor PM2 is connected to a drain of the fourth PMOS transistor PM4, a drain of the second PMOS transistor PM2 is connected to the ground $V_{GND}$ by means of a third weak pull-down device, a gate of the second PMOS transistor PM2 is connected to the ground $V_{GND}$ by means of a fourth weak pull-down device, and the gate of the second PMOS transistor PM2 is also connected to a gate of the third PMOS transistor PM3. A source of the third PMOS transistor PM3 is connected to the bulk voltage output terminal $V_{MAX}$ by means of a fifth weak pull-down device, the source of the third PMOS transistor PM3 is also connected to a gate of the fourth PMOS transistor PM4, and a drain of the third PMOS transistor PM3 is connected to the ground $V_{GND}$ by means of a sixth weak pull-down device. The gate of the third PMOS transistor PM3 is connected to the drain of the first PMOS transistor PM1 and the gate of the second PMOS transistor PM2, and the gate of the third PMOS transistor PM3 is also connected to the ground $V_{GND}$ by means of a seventh weak pull-down device. A source of the four PMOS transistor PM4 is connected to the bulk voltage output terminal $V_{MAX}$ by means of an eighth weak pull-down device, a drain of the fourth PMOS transistor PM4 is connected to the source of the second PMOS transistor PM2, a gate of the fourth PMOS transistor PM4 is connected to the bulk voltage output terminal $V_{MAX}$, and the gate of the fourth PMOS transistor PM4 is also connected to the source of the third PMOS transistor PM3. The weak pull-down devices each are a current source device, a resistor, or a combination of the current source device and the resistor. The weak pull-down devices include a first resistor R1, a second resistor R2, a third resistor R3, a fourth resistor R4, a fifth resistor R5, and current source devices. The current source devices include a first NMOS transistor NM1, a second NMOS transistor NM2, and a third NMOS transistor NM3. One end of the first resistor R1 is connected to the source of the first PMOS transistor PM1, and another end of the first resistor R1 is connected to the second voltage input terminal $V_{SPAD}$. One end of the second resistor R2 is connected to the drain of the first PMOS transistor PM1 and the gate of the first NMOS transistor NM1, respectively. Another end of the second resistor R2 is connected to the ground $V_{GND}$. One end of the third resistor R3 is connected to the drain of the first NMOS transistor NM1 and the gate of the second NMOS transistor NM2 respectively, and another end of the third resistor R3 is connected to the first voltage input terminal $V_{CC}$. The source of the first NMOS transistor NM1 is connected to the ground $V_{GND}$. One end of the fourth resistor R4 is connected to the source of the fourth PMOS transistor PM4, and another end of the fourth resistor R4 is connected to the bulk voltage output terminal $V_{MAX}$. One end of the fifth resistor R5 is connected to the source of the third PMOS transistor PM3 and the gate of the fourth PMOS transistor PM4 respectively, and another end of the fifth resistor R5 is connected to the bulk voltage output terminal $V_{MAX}$. The drain of the first NMOS transistor NM1 is connected to the first voltage input terminal $V_{CC}$ by means of the third resistor R3, the drain of the first NMOS transistor NM1 is also connected to the gate of the second NMOS transistor NM2, and the gate of the first NMOS transistor NM1 is connected to the drain of the first PMOS transistor PM1. The source of the second NMOS transistor NM2 is connected to the ground $V_{GND}$, and the drain of the second NMOS transistor NM2 is connected to the drain of the second PMOS transistor PM2. The gate of the second NMOS transistor NM2 is connected to the drain of the first NMOS transistor NM1. The source of the third NMOS transistor NM3 is connected to the ground $V_{GND}$, and the drain of the third NMOS transistor NM3 is connected to the drain of the third PMOS transistor PM3. The gate of the third NMOS transistor NM3 is connected to the gate of the third PMOS transistor PM3 and the gate of the second PMOS transistor PM2, respectively.

The bulk switching unit 11 includes a fifth PMOS transistor PM5 and a sixth PMOS transistor PM6. A source of the fifth PMOS transistor PM5 is connected to the bulk voltage output terminal $V_{MAX}$, a drain of the fifth PMOS transistor PM5 is connected to the first voltage input terminal $V_{CC}$, and a gate of the fifth PMOS transistor PM5 is connected to the source of the second PMOS transistor PM2 and the drain of the fourth PMOS transistor PM4 respectively. A source of the sixth PMOS transistor PM6 is connected to the bulk voltage output terminal $V_{MAX}$, and a drain of the sixth PMOS transistor PM6 is connected to the second voltage input terminal $V_{SPAD}$. A gate of the sixth PMOS transistor PM6 is connected to the source of the third PMOS transistor PM3 and the gate of the fourth PMOS transistor PM4, respectively. The bulks of the first PMOS transistor PM1, the second PMOS transistor PM2, the third PMOS transistor PM3, and the fourth PMOS transistor PM4, the fifth PMOS transistor PM5, and the sixth PMOS transistor PM6 are connected together.

The threshold voltages of the first PMOS transistor, the second PMOS transistor, the third PMOS transistor, the fourth PMOS transistor, the fifth PMOS transistor, and the sixth PMOS transistor each are $V_{TH}$. The first voltage input terminal is $V_{CC}$, the second voltage input terminal is $V_{SPAD}$, and the bulk voltage output terminal is $V_{MAX}$. When $V_{SPAD} \leq V_{CC}$, $V_{MAX}$ is $V_{CC}$. When $V_{SPAD} \geq V_{CC}+V_{TH}$, $V_{MAX}$ is switched to $V_{SPAD}$.

Specifically, the above circuit is analyzed by five branches:

When $0 \leq V_{SPAD} \leq V_{CC} \leq 3.3V$, that is, in a normal application condition, $V_{SPAD}$ and $V_{CC}$ are both less than 3.3V. In this disclosure, all devices work at a safe voltage, and there is no risk of withstand voltage.

A first branch: the first branch includes the first resistor R1, the first PMOS transistor PM1, and the second resistor R2. $V_{SPAD} \leq V_{CC}$, therefore the first PMOS transistor PM1 is off, and $V_{NET1}$ is pulled down to the ground $V_{GND}$ by the second resistor R2, and then $V_{NET1}=0$. In this branch, since the first PMOS transistor PM1 is off, no loop is formed from the power supply to the ground $V_{GND}$, and no power is consumed.

A second branch: the second branch includes the first NMOS transistor NM1 and the third resistor R3. For the first NMOS transistor NM1, the gate thereof is pulled down to the ground $V_{GND}$ by the second resistor R2, the first NMOS transistor NM1 is off, and $V_{NET2}$ is pulled up to $V_{CC}$ by the third resistor R3, therefore, $V_{NET2}=V_{CC}$. Since the first NMOS transistor NM1 is off, the second branch does not consume power.

A third branch: the third branch includes the fifth resistor R5, the third PMOS transistor PM3, and the third NMOS transistor NM3. $V_{NET1}=0$, therefore, the third NMOS transistor NM3 is off, the third PMOS transistor PM3 is on, and the branch from the third PMOS transistor PM3 and the third NMOS transistor NM3 to the ground $V_{GND}$ is not conductive. $V_{NET4}$ is pulled up to $V_{MAX}$ by the fifth resistor R5, and then $V_{NET4}=V_{MAX}$. Since the third NMOS transistor NM3 is off, the third branch does not consume power.

A fourth branch: the fourth branch includes the fourth resistor R4, the fourth PMOS transistor PM4, the second PMOS transistor PM2, and the second NMOS transistor NM2. $V_{NET4}=V_{MAX}$, and the fourth PMOS transistor PM4 is off. $V_{NET1}=0$, $V_{NET2}=V_{CC}$, and the second PMOS transistor PM2 and the second NMOS transistor NM2 both turn on, and $V_{NET3}$ is pulled down to a potential $V_{TH(PM2)}$. Since the fourth PMOS transistor PM4 is off, the fourth branch does not consume power.

A fifth branch: the fifth branch includes the fifth PMOS transistor PM5 and the sixth PMOS transistor PM6. Since $V_{NET3}=V_{TH(PM2)}$, when the voltage $V_{CC}>V_{TH(PM2)}+V_{TH(PM5)}$, the fifth PMOS transistor PM5 turn on, and then $V_{MAX}=V_{CC}$. Since $V_{NET4}=V_{MAX}$, the sixth PMOS transistor PM6 is off, and no leakage current flows from $V_{CC}$ to $V_{SPAD}$. Each sub-branch of the fifth branch has part of devices being off, therefore no current loop is formed from the power supply to the ground $V_{GND}$, and no power is consumed.

When $0 \leq V_{CC}+V_{TH} \leq V_{SPAD} \leq 5.0V$, it is a 5V-Tolerance application. $V_{CC}$ is below 3.3V, and the maximum voltage of $V_{SPAD}$ reaches 5V. For a high voltage of 5V, it may cause the risk of withstand voltage of the device, so it is necessary to design the circuit reasonably to avoid the risk.

For the first branch including the first resistor R1, the first PMOS transistor PM1, and the second resistor R2, when $V_{SPAD}>V_{CC}+V_{TH(PM1)}$, the first PMOS transistor PM1 will turn on, and the generated branch current is $$I_1 = \frac{V_{SPAD} - V_{CC} - V_{TH(PM1)}}{R1}.$$

After the current flows through the second resistor R2, the voltage drop across the second resistor R2 is $$V_{NET1} = I_1 * R_2 = \frac{R2}{R1}(V_{SPAD} - V_{CC} - V_{TH(PM1)}).$$

For the second branch including the first NMOS transistor NM1 and the third resistor R3, as the voltage $V_{SPAD}$ increases, the voltage $V_{NET1}$ gradually increases. When $V_{NET1}$ exceeds the threshold voltage of the first NMOS transistor NM1, that is, when $V_{NET1} > V_{TH}(NM1)$, the first NMOS transistor NM1 turns on, and $V_{NET2}$ is pulled down to the ground $V_{GND}$. The current consumption in the second branch is:

$$I_2 = \frac{V_{CC}}{R3}.$$

For the third branch including the fifth resistor R5, the third PMOS transistor PM3, and the third NMOS transistor NM3, when VNET1 exceeds a threshold voltage of the third NMOS transistor NM3, the third NMOS transistor NM3 will turn on, and the third PMOS transistor PM3 takes function of shifting a level. The voltage VNET4 is calculated as:

$$V_{NET4} = V_{NET1} + V_{TH(PM3)} = \frac{R2}{R1}(V_{SPAD} - V_{CC} - V_{TH(PM1)}) + V_{TH(PM3)},$$

and the current consumption in the third branch is:

$$I_4 = \frac{V_{MAX} - V_{NET4}}{R_5} = \frac{V_{MAX} - V_{TH(PM3)}\frac{R2}{R1}(V_{SPAD} - V_{CC} - V_{TH(PM1)})}{R_5}.$$

For the fourth branch including the fourth resistor R4, the fourth PMOS transistor PM4, the second PMOS transistor PM2, and the second NMOS transistor NM2, since $V_{NET2}$ is pulled down to the ground $V_{GND}$, the second NMOS transistor NM2 is turned off. The $V_{NET4}$ calculated above is an intermediate level. When $V_{NET4}$ is lower than $V_{MAX}$ by a voltage threshold, the fourth PMOS transistor PM4 will turn on. At this time, $V_{NET3}$ is pulled up to $V_{MAX}$ by the fourth resistor R4. Since the second NMOS transistor NM2 is off, no current loop is formed, and the branch does not consume a current.

For the fifth branch including the fifth PMOS transistor PM5 and the sixth PMOS transistor PM6, $V_{NET3}$ is pulled up to $V_{CC}$; $V_{NET4}$ is the intermediate level; the fifth PMOS transistor PM5 is off; the sixth PMOS transistor PM6 turns on; $V_{MAX} = V_{SPAD}$; and no current loop is formed in this branch, and no current is consumed.

Analyses of withstand voltage characteristics of the devices: in the present disclosure, the devices connected to a high voltage are the first PMOS transistor PM1 to the sixth PMOS transistor PM6, and these devices may have risks of withstand voltage. The port voltages of these devices are analyzed one by one as follows, and the analyses are focused on the voltage difference between the source and the gate, to determine whether the voltage difference is within the safe voltage range.

The first PMOS transistor PM1 adopts a connection of a source follower. The characteristics of the source follower make a source voltage thereof always higher than the level $V_{CC}$ by a threshold (about 0.7V, much lower than the safe working voltage of 3.3V), therefore the device has no risk of withstand voltage.

For the second PMOS transistor PM2, the voltage difference between the source and the gate is:

$$V_{SG} = V_{NET3} - V_{NET1} = V_{SPAD} - \frac{R2}{R1}(V_{SPAD} - V_{CC} - V_{TH(PM1)}).$$

The third PMOS transistor PM3 adopts a connection of a source follower, and $V_{NET1}$ and $V_{NET4}$ are both intermediate levels, therefore there is no risk of withstand voltage.

For the fourth PMOS transistor PM4 or the sixth PMOS transistor PM6, the voltage difference between the source and the gate is:

$$V_{SG} = V_{MAX} - V_{NET4} = V_{SPAD} - \frac{R2}{R1}(V_{SPAD} - V_{CC} - V_{TH(PM1)}) - V_{TH(PM3)}.$$

For the fifth PMOS transistor PM5, $V_{NET3}$ is pulled up to $V_{MAX}$, therefore the voltage difference between the source and the gate is 0, and there is no risk of withstand voltage.

It can be seen from the above analyses that the second PMOS transistor PM2, the fourth PMOS transistor PM4, and the sixth PMOS transistor PM6 may have risks of withstand voltages. As can be seen from the expression of the source-gate voltage difference, the source-gate voltage difference is related with the first resistor R1 and the second resistor R2. Therefore, a reasonable design of the resistances R2 and R1 can ensure that the source-gate voltage difference is within the safe voltage range. Specifically, when the following expressions are met:

$$V_{(SG,PM2)} = V_{SPAD} - \frac{R2}{R1}(V_{SPAD} - V_{CC} - V_{TH(PM1)}) < 3.3, \text{ and}$$

$$V_{(SG,PM4/PM6)} = V_{SPAD} - \frac{R2}{R1}(V_{SPAD} - V_{CC} - V_{TH(PM1)}V_{TH(PM3)}) < 3.3,$$

it can be ensured that the source-gate voltage difference is within the safe voltage range.

Power consumption analysis: a total current consumption of the circuit is a sum of the working current consumptions of all branches. As can be seen from the current consumption expression of each branch, the total current consumption is related with the resistors R2, R1, and R5. Therefore, a reasonable design of the resistance values of R2, R1, and R5 can ensure that the total current consumption of the circuit is in a very low range.

In summary, the present disclosure can realize the function of switching voltage automatically within the normal working voltage range without consuming power. In the case of 5V-Tolerance applications, by reasonably designing the resistance values of R1, R2, and R5, it can be ensured that the circuit consumes only a lowest power under the condition of a safe withstand voltage, thereby realizing the function of automatic switching between multiple power supply voltages.

A simulation is performed for the above-mentioned circuit, and parameters are designed as follows: R1=1 Mohm, R2=1.2 Mohm, R3=2.5 Mohm, R4=300 Kohm, and R5=2.0 Mohm.

Figure 3:
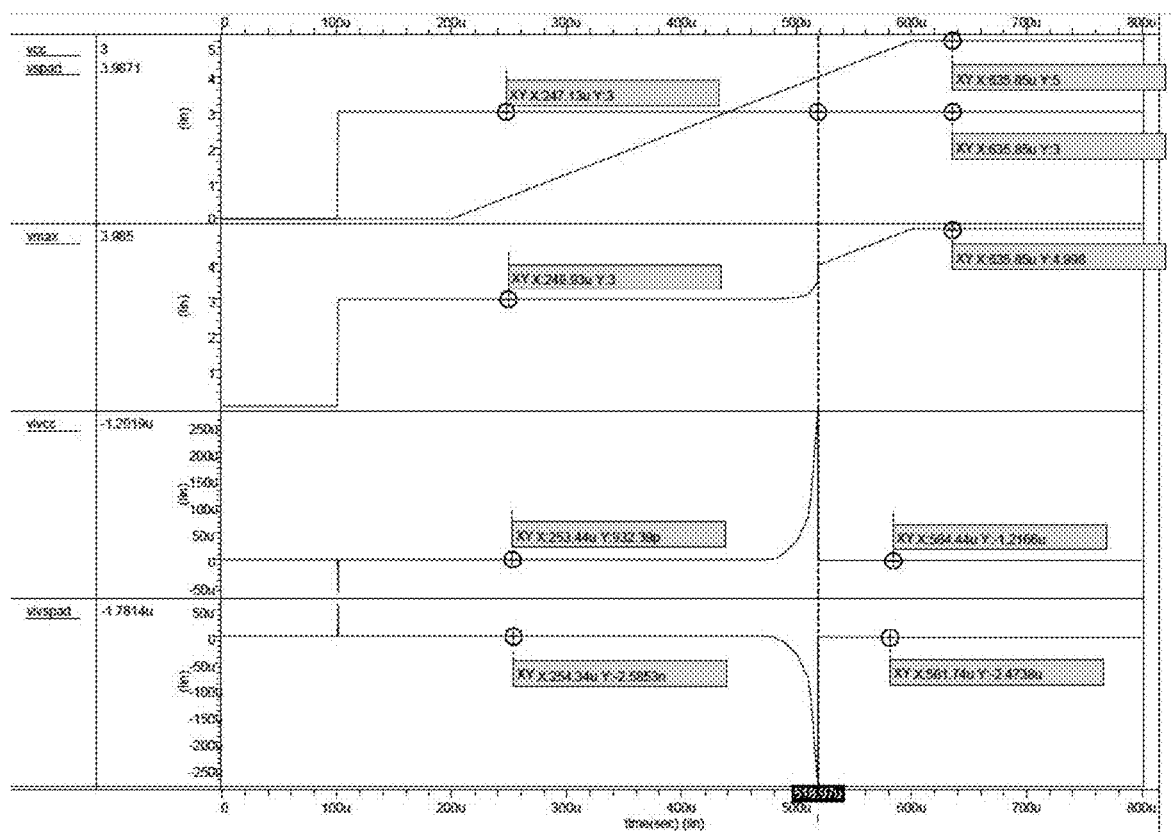
FIG. 3 is a diagram illustrating logic function verification and power consumption verification of the present disclosure.

FIG. 3 is a diagram illustrating logic function verification and power consumption verification of the present disclosure, and it will be described by three stages.

At a first stage, the system is not powered during 100 uS shown on the time axis. $V_{CC}=0$, $V_{SPAD}=0$, and the output $V_{MAX}=0$, and there is no power consumption at this stage.

At a second stage, during a time period between 100 uS and 518 uS shown on the time axis, $V_{CC}=3.0V$, $V_{SPAD}$ gradually rises from 0V to about 4V (higher than $V_{CC}$ by a threshold voltage), the output $V_{MAX}=V_{CC}$, and there is no power consumption at this stage either.

At a third stage, during a time period between 518 uS and 800 uS shown on the time axis, $V_{CC}$=3.0V, $V_{SPAD}$ gradually rises from 4.0V to 5V, the output $V_{MAX}$=$V_{SPAD}$, $IV_{CC}$=1.2 uA, and $IV_{SPAD}$=2.5 uA, and the total power consumption is 3.7 uA.

The above simulation verification results show that the circuit of the present disclosure can realize automatic switching between different power supplies. The circuit does not consume power in the case of normal application, and the circuit consumes a lowest power (about 3.7 uA) in the case of 5V-Tolerance application.

Figure 4:
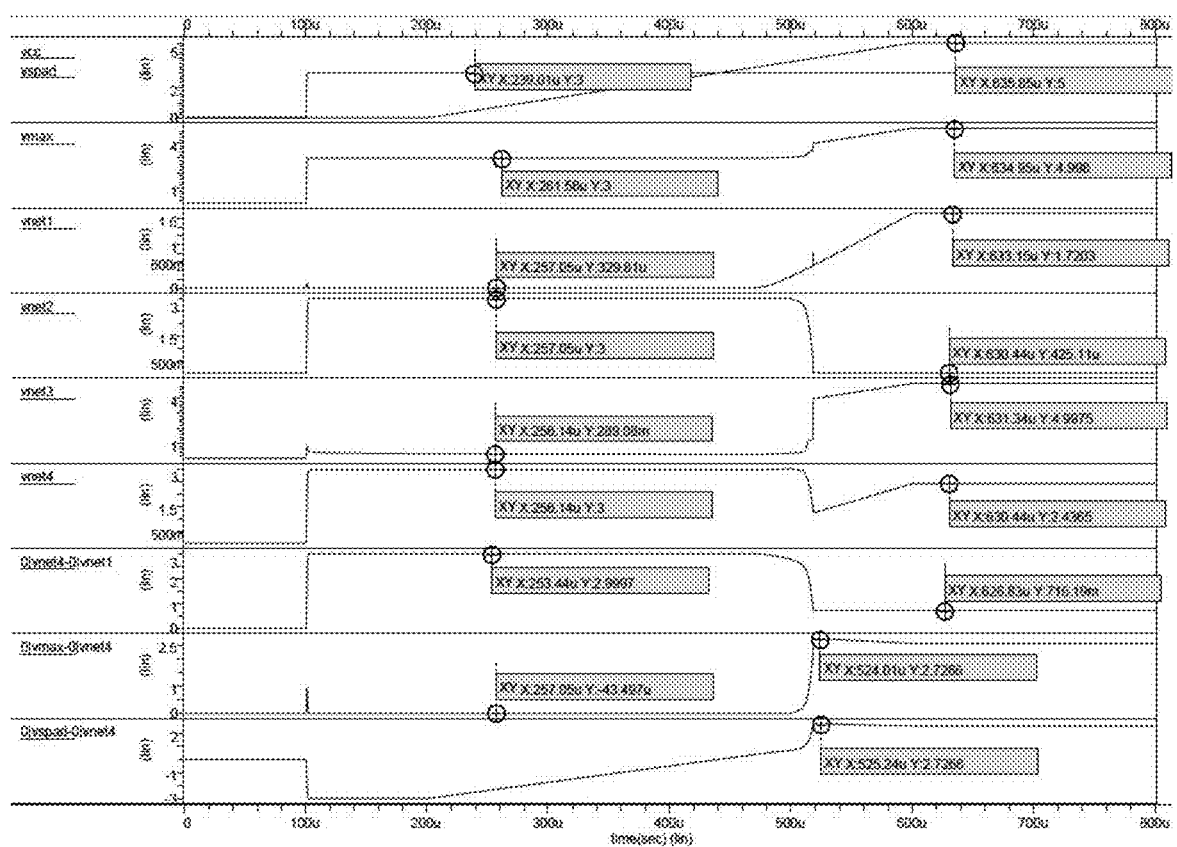
FIG. 4 is a diagram illustrating internal nodes for the logic function verification of the circuit of the present disclosure.

FIG. 4 is a diagram illustrating internal nodes for the logic function verification of the circuit of the present disclosure, and the analyses are focused on the analysis for the second PMOS transistor PM2, the fourth PMOS transistor PM4, and the sixth PMOS transistor PM6, which may have risks of withstand voltages.

For the second PMOS transistor PM2, the source-gate voltage difference is $V_{NET3}$-$V_{NET1}$, and the maximum voltage difference is within 3.3V in the entire switching process. It is confirmed that the operating voltage of the port of the device is within the safe range.

For the fourth PMOS transistor PM4, the source-gate voltage difference is $V_{MAX}$-$V_{NET4}$, and the maximum voltage difference is within 3.0V in the entire switching process. It is confirmed that the operating voltage of the port of the device is within the safe range.

For the sixth PMOS transistor PM6, the source-gate voltage difference is $V_{SPAD}$-$V_{NET4}$, and the maximum voltage difference is within 3.0V in the entire switching process. It is confirmed that the operating voltage of the port of the device is within the safe range.

The above simulation verification results show that, when the circuit of the present disclosure realizes automatic switching between multiple power supplies, the working voltage of each port is within the safe range, and there is no risk of withstand voltage.

Figure 5:
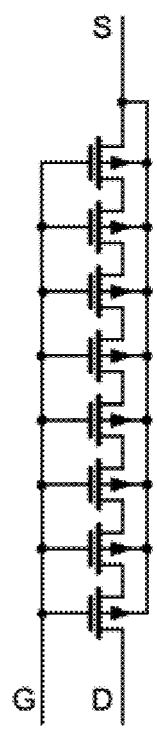
FIG. 5 is a diagram illustrating a connection mode of an MOS circuit replacing a first resistor R1, a third resistor R3, a fourth resistor R4, and a fifth resistor R5 of the present disclosure.

In some embodiments, the first resistor R1, the third resistor R3, the fourth resistor R4, and the fifth resistor R5 are replaced by an MOS circuit having the connection mode shown in FIG. 5. All resistors or resistors of any combination mode are replaced.

An integrated chip is provided, and includes the above-mentioned low power consumption switching circuit with voltage isolation function for the PMOS transistor bulk.

From the above description of the present disclosure, it can be seen that, compared with the prior art, the low power consumption switching circuit with voltage isolation function for the PMOS transistor bulk provided by the present disclosure adopts an isolation method for device withstand voltage, thereby making the withstand voltage of the device to be controlled within the safe working range, enabling the device with a low withstand voltage to realize a high withstand voltage by means of the automatic switching circuit for the bulk, increasing the resolution of the difference between the power supply voltages, lowering the power consumption. The present disclosure not only reduces the production cost of the chip, but also improves the compatibility of the withstand voltage of the chip, thereby broadening the application scope of the chip.

The technical features of the above-described embodiments may be arbitrarily combined. For the sake of brevity of description, not all possible combinations of the various technical features in the above embodiments are described. However, as long as there is no contradiction between the combinations of these technical features, all should be considered within the scope of the disclosure.

The above-mentioned embodiments are merely several embodiments of the present disclosure, and the description thereof is more specific and detailed, but not intended to limit the scope of the disclosure. It should be noted that various variations and modifications may be made by those skilled in the art without departing from the conception of the present disclosure, and these variations and modifications are all within the scope of the present disclosure. Therefore, the scope of the present disclosure should be subject to the appended claims.

What is claimed is:

1. A low power consumption switching circuit with voltage isolation function for a PMOS transistor bulk, comprising a bulk voltage switching control unit, a bulk voltage switching unit, a first voltage input terminal, a second voltage input terminal, and a bulk voltage output terminal; wherein:

the bulk voltage switching control unit comprises a first plurality of PMOS transistors and a plurality of pull-down devices, and is configured to generate a control signal to control the bulk voltage switching unit, thereby connecting the bulk voltage output terminal to a higher potential between the first voltage input terminal and the second voltage input terminal at all times;

the bulk voltage switching unit comprises a second plurality of PMOS transistors, and is configured to connect bulks of the PMOS transistors to the higher potential between the first voltage input terminal and the second voltage input terminal at all times; and wherein each PMOS transistor of both the first and second plurality of PMOS transistors is a low-withstand-voltage device;

the first plurality of PMOS transistors comprises a first PMOS transistor, a second PMOS transistor, a third PMOS transistor, a fourth PMOS transistor, and the plurality of pull-down devices comprises a first pull-down device, a second pull-down device, a third pull-down device, a fourth pull-down device, a fifth pull-down device, a sixth pull-down device, a seventh pull-down device, and an eighth pull-down device;

a source of the first PMOS transistor is connected to the second voltage input terminal by means of the first pull-down device; a drain of the first PMOS transistor is connected to a ground by means of the second pull-down device; a gate of the first PMOS transistor is connected to the first voltage input terminal;

a source of the second PMOS transistor is connected to a drain of the fourth PMOS transistor, a drain of the second PMOS transistor is connected to the ground by means of the third pull-down device; a gate of the second PMOS transistor is connected to the ground by means of the fourth pull-down device; the gate of the second PMOS transistor is also connected to a gate of the third PMOS transistor;

a source of the third PMOS transistor is connected to the bulk voltage output terminal by means of the fifth pull-down device; the source of the third PMOS transistor is also connected to a gate of the fourth PMOS transistor; a drain of the third PMOS transistor is connected to the ground by means of the sixth pull-down device; the gate of the third PMOS transistor is connected to the drain of the first PMOS transistor and the gate of the second PMOS transistor; the gate of the third PMOS transistor is also connected to the ground by means of the seventh pull-down device;

a source of the fourth PMOS transistor is connected to the bulk voltage output terminal by means of the eighth pull-down device; the drain of the fourth PMOS transistor is connected to the source of the second PMOS transistor, the gate of the fourth PMOS transistor is connected to the bulk voltage output terminal; and the gate of the fourth PMOS transistor is also connected to the source of the third PMOS transistor.

2. The low power consumption switching circuit with voltage isolation function for the PMOS transistor bulk according to claim 1, wherein each of the pull-down devices is a current source device, a resistor, or a combination of the current source device and the resistor.

3. The low power consumption switching circuit with voltage isolation function for the PMOS transistor bulk according to claim 2, wherein the pull-down devices comprise a first resistor, a second resistor, a third resistor, a fourth resistor, a fifth resistor, and current source devices;
the current source devices comprise a first NMOS transistor, a second NMOS transistor, and a third NMOS transistor;
one end of the first resistor is connected to the source of the first PMOS transistor, and another end of the first resistor is connected to the second voltage input terminal;
one end of the second resistor is connected to the drain of the first PMOS transistor and a gate of the first NMOS transistor, respectively; another end of the second resistor is connected to the ground;
one end of the third resistor is connected to a drain of the first NMOS transistor and a gate of the second NMOS transistor respectively; another end of the third resistor is connected to the first voltage input terminal;
a source of the first NMOS transistor is connected to the ground;
one end of the fourth resistor is connected to the source of the fourth PMOS transistor, and another end of the fourth resistor is connected to the bulk voltage output terminal;
one end of the fifth resistor is connected to the source of the third PMOS transistor and the gate of the fourth PMOS transistor respectively, and another end of the fifth resistor is connected to the bulk voltage output terminal;
the drain of the first NMOS transistor is connected to the first voltage input terminal by means of the third resistor; the drain of the first NMOS transistor is also connected to the gate of the second NMOS transistor; the gate of the first NMOS transistor is connected to the drain of the first PMOS transistor;
a source of the second NMOS transistor is connected to the ground; a drain of the second NMOS transistor is connected to the drain of the second PMOS transistor; the gate of the second NMOS transistor is connected to the drain of the first NMOS transistor;
a source of the third NMOS transistor is connected to the ground; a drain of the third NMOS transistor is connected to the drain of the third PMOS transistor; and a gate of the third NMOS transistor is connected to the gate of the third PMOS transistor and the gate of the second PMOS transistor, respectively.

4. The low power consumption switching circuit with voltage isolation function for the PMOS transistor bulk according to claim 1, wherein the second plurality of PMOS transistors further comprises a fifth PMOS transistor and a sixth PMOS transistor;
a source of the fifth PMOS transistor is connected to the bulk voltage output terminal; a drain of the fifth PMOS transistor is connected to the first voltage input terminal; a gate of the fifth PMOS transistor is connected to the source of the second PMOS transistor and the drain of the fourth PMOS transistor respectively;
a source of the sixth PMOS transistor is connected to the bulk voltage output terminal; a drain of the sixth PMOS transistor is connected to the second voltage input terminal; and a gate of the sixth PMOS transistor is connected to the source of the third PMOS transistor and the gate of the fourth PMOS transistor, respectively.

5. The low power consumption switching circuit with voltage isolation function for the PMOS transistor bulk according to claim 4, wherein a bulk of the first PMOS transistor, a bulk of the second PMOS transistor, a bulk of the third PMOS transistor, a bulk of the fourth PMOS transistor, a bulk of the fifth PMOS transistor, and a bulk of the sixth PMOS transistor are connected together.

6. The low power consumption switching circuit with voltage isolation function for the PMOS transistor bulk according to claim 5, wherein: threshold voltages of the first PMOS transistor, the second PMOS transistor, the third PMOS transistor, the fourth PMOS transistor, the fifth PMOS transistor, and the sixth PMOS transistor each are $V_{TH}$; the first voltage input terminal is $V_{CC}$; the second voltage input terminal is $V_{SPAD}$; the voltage output terminal of the bulk is $V_{MAX}$;
when $V_{SPAD} \leq V_{CC}$, $V_{MAX}$ is switched to $V_{CC}$; and
when $V_{SPAD} \geq V_{CC} + V_{TH}$, $V_{MAX}$ is switched to $V_{SPAD}$.

7. The low power consumption switching circuit with voltage isolation function for the PMOS transistor bulk according to claim 4, wherein: threshold voltages of the first PMOS transistor, the second PMOS transistor, the third PMOS transistor, the fourth PMOS transistor, the fifth PMOS transistor, and the sixth PMOS transistor each are $V_{TH}$; the first voltage input terminal is $V_{CC}$; the second voltage input terminal is $V_{SPAD}$; the voltage output terminal of the bulk is $V_{MAX}$;
when $V_{SPAD} \leq V_{CC}$, $V_{MAX}$ is switched to $V_{CC}$; and
when $V_{SPAD} \geq V_{CC} + V_{TH}$, $V_{MAX}$ is switched to $V_{SPAD}$.

8. An integrated chip, comprising the low power consumption switching circuit with voltage isolation function for the PMOS transistor bulk according to claim 1.

* * * * *